Figure 1:
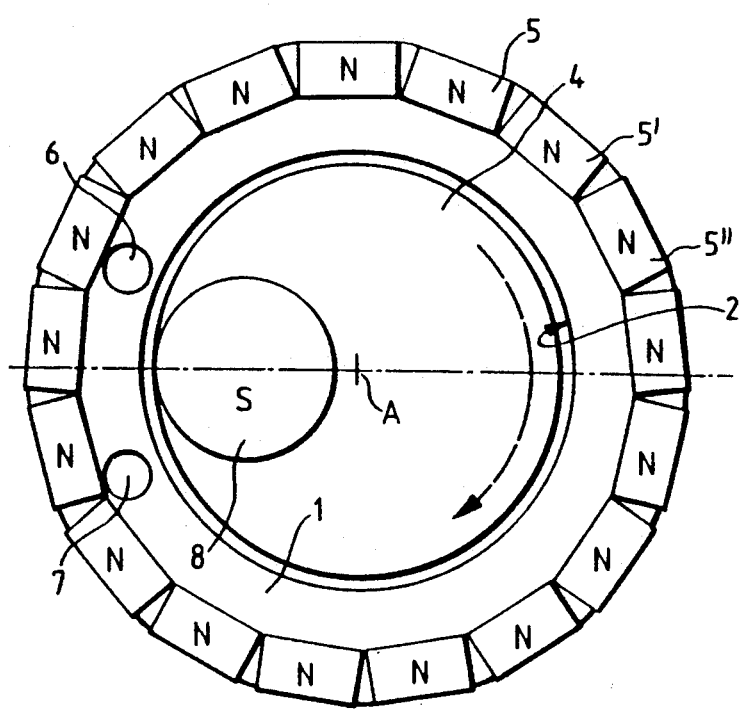

United States Patent [19]

Maass

[11] Patent Number: 5,284,564
[45] Date of Patent: Feb. 8, 1994

[54] MAGNETRON SPUTTERING CATHODE FOR VACUUM COATING APPARATUS

[75] Inventor: Wolfram Maass, Erlensee, Fed. Rep. of Germany

[73] Assignee: Leybold Aktiengesellschaft, Hanau, Fed. Rep. of Germany

[21] Appl. No.: 768,012

[22] Filed: Sep. 30, 1991

[30] Foreign Application Priority Data

Jul. 30, 1991 [DE] Fed. Rep. of Germany ....... 4125110

[51] Int. Cl.⁵ ............................................. C23C 14/35
[52] U.S. Cl. ............................ 204/298.2; 204/192.12
[58] Field of Search ....................... 204/298.2, 192.12

[56] References Cited

U.S. PATENT DOCUMENTS

| | | | |
|---|---|---|---|
| 4,444,643 | 4/1984 | Garrett | 204/298.2 |
| 4,746,417 | 5/1988 | Ferenbach et al. | 204/298.2 |
| 4,746,417 | 5/1988 | Ferenbach et al. | 204/298.2 |
| 5,047,130 | 9/1991 | Akao et al. | 204/192.12 |

FOREIGN PATENT DOCUMENTS

| | | | |
|---|---|---|---|
| 0248244 | 12/1987 | European Pat. Off. | 204/298.2 |
| 0337012 | 10/1989 | European Pat. Off. | 204/298.2 |
| 0399710 | 11/1990 | European Pat. Off. | 204/298.2 |
| 2707144 | 8/1977 | Fed. Rep. of Germany | 204/298.2 |
| 36191949 | 2/1983 | Fed. Rep. of Germany | 204/298.2 |
| 59-56580 | 4/1984 | Japan | 204/298.2 |
| 63-290275 | 11/1988 | Japan | 204/298.2 |
| 2-305960 | 12/1990 | Japan | 204/298.2 |

OTHER PUBLICATIONS

Patent Abstracts of Japan: vol. 8, No. 150 (C-233) (1587) Jul. 12, 1984 and JP-A-59 56 580 (Fujitsu) Apr. 2, 1984, Abstract.
Patent Abstracts of Japan: vol. 14 No. 568 (E-1014) Dec. 18, 1990 and JP-A-02 246 216 (Hitachi) Oct. 2, 1990.
Patent Abstracts of Japan, 2-11761 A, C-702, Mar. 15, 1990, vol. 14, No. 137.
Patent Abstracts of Japan, 63-282263 A, C-576, Mar. 14, 1989, vol. 13, No. 107.

Primary Examiner—Aaron Weisstuch
Attorney, Agent, or Firm—Felfe & Lynch

[57] ABSTRACT

In a magnetron sputtering cathode for vacuum coating apparatus with a circular target plate and a plurality of magnet arrangements arranged behind the target plate and with a drive means for the continuous rotation of at least one of the magnet arrangements (12, 12') about the central axis A of the target plate, there is provided, in the radially outer marginal area of the target plate, a first magnet arrangement (15, 15', . . .) for the production of a magnetic tunnel section substantially concentric with the axis of rotation A, and between the axis of rotation A and the first magnet arrangement (15, 15', . . .) and, between the axis of rotation A and the first magnet arrangement (15, 15', . . .), a second magnet arrangement (12, 12') offset radially inwardly, and a third magnet arrangement (11, 11', . . .) which cooperate with the first magnet arrangement (15, 15', . . .) for the production of the magnetic tunnel section which extends substantially over one sector of the target plate, the second magnet system being formed from a group of individual magnets (12, 12') such that, upon a rotation of the second magnet arrangement (12, 12') about the axis of rotation (A) or of a fourth magnet arrangement (13) the surface elements of the target plate are eroded more strongly at the margin, so that a substrate field mounted opposite the target plate becomes uniformly coated.

4 Claims, 2 Drawing Sheets

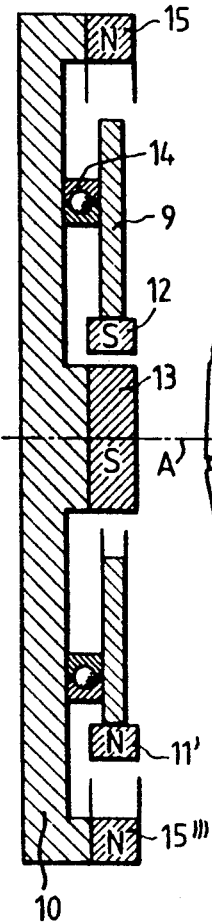
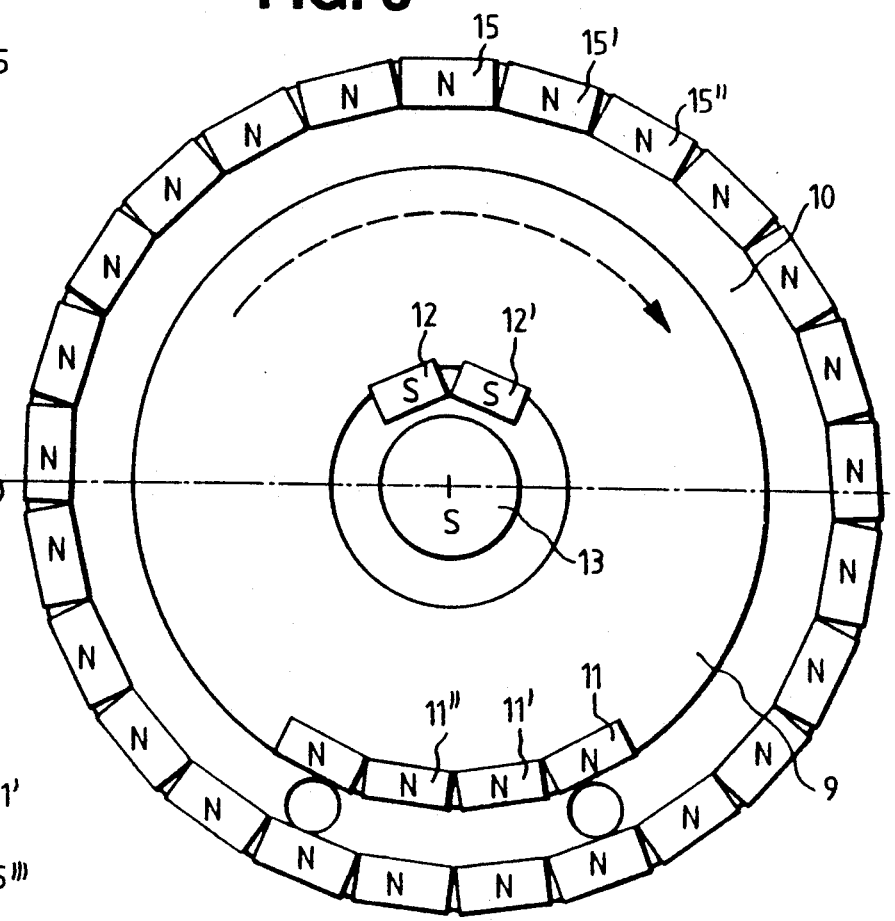
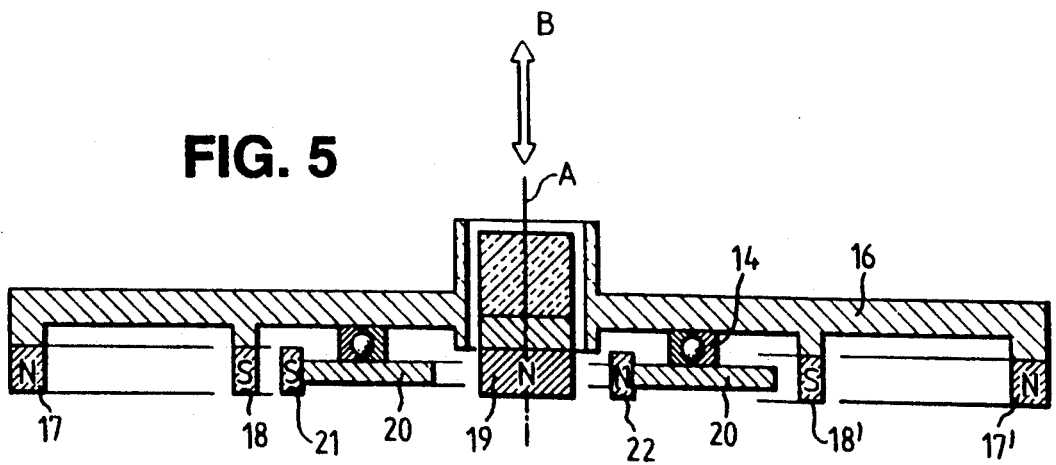

MAGNETRON SPUTTERING CATHODE FOR VACUUM COATING APPARATUS

The invention relates to a magnetron sputtering cathode for vacuum coating apparatus with a circular target plate made of the material to be sputtered, with a plurality of magnet arrangements disposed in back of the target plate and having at least one self-contained row of permanent magnets, the magnets of this self-contained row having all the same polarity, but the magnets of a second magnet arrangement having the opposite polarity, such that over the target plate at least one tunnel is formed of magnetic lines of force issuing from the one magnet arrangement and returning to the adjacent magnet arrangement, and with a driving means for the continuous rotation of one magnet arrangement about the central axis of the target plate.

Magnetron sputtering cathodes are characterized by a sputtering rate that is higher by a factor of 10 to 30 than sputtering systems unsupported by a magnetic field. This advantage, however, is obtained at the cost of an extremely uneven sputtering of the target plate, because the constriction of the plasma imposed by the magnetic tunnel expresses itself in a corresponding spatial limitation of the sputtering effect. Due to the formation of a deep erosion pit, whose deepest point lies under the culmination points of the magnetic lines of force, the sputtering process has to be terminated after only about 25 to 30% of the target material has been sputtered.

In stationary coating systems, i.e., in those having no relative movement between the cathode and the substrates, this results in very irregular distributions of the coating thickness. In principle, the image of the erosion pit would be formed almost photographically on the substrates.

This problem as well as a number of attempts at its solution is addressed in German Patent Disclosure Document 27 07 144. These attempts include a magnetron sputtering cathode of the kind described above, in which a single, self-contained magnet system rotates in an off center position in back of a circular target plate (FIGS. 22 to 25).

Aside from the fact that in this case only a tiny portion of the target surface is simultaneously exposed to the sputtering (thereby nullifying part of the magnetron effect), the sputtering rate on the target surface is also very irregular, because on the one hand the dwell times under the rotating magnetic tunnel are irregular and on the other hand because the product of the intensity of the plasma, the so-called plasma density, and the dwell time differ in the radial direction. An irregular sputtering rate, however, results not only in an irregular erosion of the target material, but also in an irregular rate of deposition on the substrates situated opposite the target surface.

Lastly, a magnetron sputtering cathode for vacuum coating apparatus is known (P 36 19 194.9) having a circular target plate of the material to be sputtered, and having at least one magnet system disposed in back of the target plate, which consists of two self-contained rows of permanent magnets, one inside the other, wherein the magnets of each individual row have the same polarity but the magnets of the two rows having an opposite polarity, such that over the target plate at least one self-contained tunnel of magnetic lines of force issuing from the one row of magnets and returning to the other row of magnets is formed, and having a driving means for the continuous rotation of the magnet system about the central axis of the target plate, while a first magnet system for the production of a first magnetic tunnel substantially concentric with the axis of rotation is disposed in the marginal area of the target plate, and between the axis of rotation and the first magnet system a second, off-center magnet system is disposed which extends over only one sector of the target plate such that, upon a common rotation of both magnet systems, the surface elements of the target plate are exposed to the product of intensity and dwell time such that the target plate is more uniformly eroded in the central area and more strongly eroded at the margin, so that a substrate area mounted opposite the target plate is coated.

The invention is therefore addressed to the problem, in a magnetron sputtering cathode of the type described above, of further improving the coating thickness distribution on the substrates in comparison to the prior-art cathodes.

The solution of the stated problem is obtained according to the invention by the fact that a) in the radial outer marginal area of the target plate there is disposed a first magnet row for the production of a magnetic tunnel section substantially concentric with the axis of rotation, and that b) between the axis of rotation and the first magnet row a second magnet arrangement offset eccentrically and radially inwardly is provided, which, for the production of the magnetic tunnel section extending substantially over one sector of the target plate, cooperates with the first magnet row, the second magnet arrangement being formed of a single permanent magnet or a group of individual magnets, such that when the second magnet arrangement rotates the surface elements of the target plate are exposed to the product of intensity and dwell time such that the target plate is eroded more uniformly and, at the margin, more strongly, so that a substrate field mounted opposite the target plate becomes uniformly coated.

The term, "substrate field," is understood to mean either the area circumscribed by the circular outline of a single substrate or of a number of smaller substrates.

By means of the features a) and b) assurance is obtained that the diminution of the rate of deposition to be observed otherwise in the marginal area of the substrate field is compensated, that also the area of the substrate field lying within the marginal area is uniformly coated, it being made possible by configuring the layout of the magnet group and of the shape of the magnetic tunnel in this sector to accomplish an extraordinarily uniform coating over the entire substrate field.

An optimization of the system can be achieved by shifting or varying the magnets arranged on the yoke plate if the technician should observe departures from the ideal distribution of the coating thickness.

It has been found in practical tests that by combining features a) and b) a very uniform coating thickness distribution and coating quality was achieved on the substrates all the way into the marginal area of the substrate field.

Three examples of embodiments of the subject matter of the invention are explained below with the aid of FIGS. 1 to 5.

Figure 2:
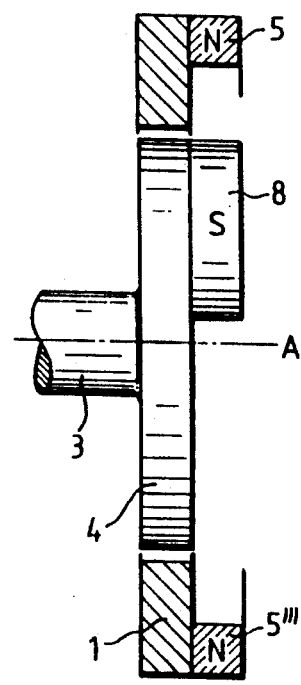

FIG. 1 is a plan view of the magnet arrangement of a magnetron sputtering cathode according to the invention, FIG. 2 is an axial section through a magnetron sputtering cathode with the magnet arrangement according to FIG. 1, FIG. 3 is a plan view of a variant of the subject matter of FIG. 1, in which a circular disk-shaped mounting is provided for two magnet groups lying radially inward, and a central, stationary middle magnet, FIG. 4 is an axial section through the sputtering cathode according to FIG. 3, and FIG. 5 is an axial section through a double-ring cathode with a middle magnet adjustable for height, and an annular holder for magnet groups, which is rotatable with respect to the magnet rows lying radially outward.

In FIGS. 1 and 2 there is represented an annular outer yoke plate 1 which has in its center an opening 2 through which a shaft 3 is brought, by which an inner yoke plate 4 is rotatable about a common concentric axis A.

A row of permanent magnets 5, 5', ... situated side by side is disposed in its radially outer marginal area, and their polarity is always the same. The annular outer yoke plate 1 is held stationary and contains cooling passages which are not shown but their connection bores are indicated by 6 and 7.

The circular disk-like, radially inner yoke plate 4 has a single, comparatively large cylindrical permanent magnet 8 which is provided off-center, and whose thickness dimension corresponds approximately to that of a parallelepipedal-shaped magnet 5, 5', ... of the closed row of magnets.

The yoke system in the embodiment according to FIGS. 1 and 2 therefore consists of two concentric parts 1 and 4, the outer part being fixedly joined to the (not further shown) target holding means, and the inner part rotating with corresponding magnetic equipment. Since the water-cooling connections 6 and 7 of the cathode are situaded near the outer yoke plate, no special configuration of the target holding means is necessary.

In the case of the embodiment according to FIGS. 3 and 4, an annular yoke plate 9 is disposed under the circular disk-shaped yoke plate 10 so that this plate can rotate about the concentric axis A, and a group of permanent magnets 11, 11', ... and 12, 12', ... of different polarities is respectively disposed fixedly both in the radially outer marginal area and in the radially inner marginal area of the yoke plate 9 (second and third magnet arrangements).

Lastly, the circular disk-like yoke plate 10 is provided in its center also with a cylindrical permanent magnet 13 (fourth magnet arrangement), and on its radially outer marginal area with a row of permanent magnets 15, 15', ... (first magnet arrangement). The annular yoke plate 9 furthermore has a ball bearing 14 which permits rotation of the yoke plate 9.

In comparison with a conventional rotationally symmetrical system, therefore, in the case of the cathode according to FIGS. 3 and 4 additional magnets 11, 11', ... and 12, 12', ... are mounted on a rotating disk 9, whereby additional magnetic fields are produced which produce a cyclical shifting of the magnetic fields and prevent the formation of erosion zones.

The embodiment according to FIG. 5 differs essentially from the one according to FIGS. 3 and 4 in that on the yoke plate 16, on its radially outer marginal area, two concentric, closed rows of permanent magnets 17, 17', ... and 18, 18', ... are provided, that the yoke plate 16 is annular in shape, and that the central magnet 19 is displaceable in the direction B of the axis of rotation A.

Furthermore, the yoke plate 20, which is in the form of a circular disk, is equipped with magnets 21 and 22 both on its radially inward area and on its radially outward area, respectively.

According to the present description, therefore, the yoke system consists essentially of two concentric parts, the outer part being joined to the target holding means (not shown) and the inner part with corresponding magnets rotates. The additional magnetic fields thereby produced bring about a cyclical shifting of the original fields and prevent the formation of erosion zones. so that the system can be called a "plasma vibration magnetron" (because on account of the rotation of a portion of the yoke and of a portion of the magnetic arrangements, the plasma ring or rings actually are set in a kind of vibrating movement).

It is clear that, instead of a uniform rotation of the inner part, an irregular movement can be provided, e.g., an abruptly accelerated or abruptly retarded movement. Likewise, a rotational movement at varying rotational speeds can be produced.

I claim:

1. Magnetron sputtering cathode for vacuum coating apparatus with a circular target plate made of the material to be sputtered, with a plurality of magnet arrangements disposed in back of the target plate and comprising at least a first magnet arrangement including a continuous row of permanent magnets on a first yoke plate having a circular border, the magnets of this continuous row all having the same polarity, at least one magnet on a second yoke plate having a circular border, the at least one magnet being of a second magnet arrangement having the opposite polarity, such that over the target plate at least one tunnel is formed of magnetic lines of force issuing from the first magnet arrangement and returning to the second magnet arrangement or vice versa, and with a driving means for the continuous rotation of the second magnet arrangement about the central axis (A) of the target plate, characterized in that a) the first magnet arrangement is fixedly disposed at the radial outer marginal area of the target plate for the production of a magnetic tunnel section substantially concentric with the axis of rotation A, and that b) between the axis of rotation A and the first magnet arrangement the second magnet arrangement is provided offset eccentrically and radially inwardly, the second magnet arrangement being formed of a single permanent magnet or a group of individual magnets, with the second magnet arrangement surrounded by the first magnet arrangement formed of a continuous row of magnets there is associated a third arrangement of permanent magnets in the radially outer area of a rotatable annular yoke plate bearing the second and third arrangement of magnets, which extends approximately over a quarter-circle, a central, fourth magnet arrangement whose polarity corresponds to that of the second magnet arrangement being disposed stationarily and surrounded by the rotatable yoke plate, such that when the second magnet arrangement rotates about the axis of rotation (A) the surface elements of the target plate are exposed to the product of intensity and dwell time such that the target plate is eroded more uniformly and, at the margin, more strongly, so that a substrate field mounted opposite the target plate becomes uniformly coated.

2. Magnetron sputtering cathode according to claim 1, characterized in that the magnets of the second and third magnet arrangement, disposed around the central magnet, are disposed on said rotatable annular yoke plate coaxial with the target plate and cooperating with a motor-driven hollow shaft, and that the magnet row of the first magnet arrangement is kept stationary.

3. Magnetron sputtering cathode according to claim 1, characterized in that the magnets of the third magnet arrangement are held on the radially outer marginal area of the annular yoke plate and the radially inward-lying magnets of the second magnet arrangement are provided on the radially inner marginal area of the yoke plate, the yoke plate being rotatable about a fixedly held, circular disk-shaped middle magnet as the fourth magnet arrangement.

4. Magnetron sputtering cathode according to claim 1, characterized in that the central magnet arrangement surrounded by the annular, rotatable yoke plate is displaceable along the axis of rotation (A).

* * * * *